US012158489B2

United States Patent
Pinheiro Martins et al.

(10) Patent No.: US 12,158,489 B2
(45) Date of Patent: Dec. 3, 2024

(54) LEAKAGE AND FLASHOVER CURRENT MONITORING SYSTEM IN VHV OVERHEAD LINE INSULATORS

(71) Applicant: REN PRO, SA, Lisbon (PT)

(72) Inventors: Jorge Filipe Pinheiro Martins, Maia (PT); Goncalo Nuno Carrageta Pintado, Setubal (PT); Tiago Frederico Teixeira Cerqueira, Coimbra (PT); Bruno Galhardo, Coimbra (PT); Luis Miguel Alves De Oliveira, Coimbra (PT); Nuno Filipe Dias Casaleiro, Coimbra (PT); Alexandre Jose Fabiao Aparicio, Coimbra (PT)

(73) Assignee: REN PRO, SA, Lisbon (PT)

( * ) Notice: Subject to any disclaimer, the term of this patent is extended or adjusted under 35 U.S.C. 154(b) by 65 days.

(21) Appl. No.: 17/999,163

(22) PCT Filed: Jun. 8, 2021

(86) PCT No.: PCT/IB2021/055028
§ 371 (c)(1),
(2) Date: Nov. 17, 2022

(87) PCT Pub. No.: WO2022/003452
PCT Pub. Date: Jan. 6, 2022

(65) Prior Publication Data
US 2023/0194592 A1    Jun. 22, 2023

(30) Foreign Application Priority Data
Jun. 30, 2020    (PT) .......................................... 116538

(51) Int. Cl.
*H01H 31/12*    (2006.01)
*G01R 31/12*    (2020.01)

(52) U.S. Cl.
CPC .............................. *G01R 31/1245* (2013.01)

(58) Field of Classification Search
CPC .. G01R 31/081; G01R 31/083; G01R 31/085; G01R 31/088; G01R 31/52; G01R 31/58;
(Continued)

(56) References Cited

U.S. PATENT DOCUMENTS 5,157,334 A * 10/1992 Lowther ............ G01R 31/1245
324/501
5,283,507 A *  2/1994 Stitt ........................ B60L 3/00
246/182 A
(Continued)

FOREIGN PATENT DOCUMENTS

| CN | 104237467   | * | 12/2014 |
| CN | 204166085   | * | 2/2015  |
| CN | 108008237 A |   | 5/2018  |

OTHER PUBLICATIONS

Tambi, et al., "Development of Real-Time Monitoring and Indentification Syatem of Aging Insulators in the Tropics", International Conference on High Voltage Engineering and Power Systems (ICHVEPS), pp. 213-217, 2019.
(Continued)

*Primary Examiner* — Thang X Le
(74) *Attorney, Agent, or Firm* — LUCAS & MERCANTI, LLP

(57) ABSTRACT

A system for real-time continuous and remote monitoring of the progressive degradation of insulators installed in Electric Power Transmission Networks, namely in Very High Voltage electric Lines (VHVL), which can be applied at lower voltage levels (High and Medium Voltage). The principle of operation is based on the identification of the occurrence of leakage currents in the insulators by registering the current (Continued)

intensities, the periods of the occurrences, and local measurements of temperature and relative humidity.

6 Claims, 3 Drawing Sheets

(58) Field of Classification Search
CPC .. G01R 31/62; G01R 31/186; G01R 31/1245; G01R 31/2827
See application file for complete search history.

(56) References Cited

U.S. PATENT DOCUMENTS

| | | | |
|---|---|---|---|
| 9,244,114 B2* | 1/2016 | Knijnik | G01R 31/1245 |
| 2008/0297162 A1* | 12/2008 | Bright | G01R 15/142 |
| | | | 324/512 |
| 2011/0012616 A1* | 1/2011 | Hyde | G01R 31/1245 |
| | | | 324/551 |
| 2013/0169285 A1 | 7/2013 | Phillips et al. | |
| 2019/0227110 A1* | 7/2019 | Lindsey | G01R 31/085 |
| 2020/0241081 A1* | 7/2020 | Zhang | G01R 31/62 |

OTHER PUBLICATIONS

International Search Report and Written Opinion for International Application No. PCT/IB2021/055028 (14 Pages) (Sep. 28, 2021).

* cited by examiner

LEAKAGE AND FLASHOVER CURRENT MONITORING SYSTEM IN VHV OVERHEAD LINE INSULATORS

CROSS-REFERENCE TO RELATED APPLICATIONS

This application is a 371 of PCT/IB2021/055028, filed Jun. 8, 2021, which claimed the priority of Portuguese Application No. 116538, filed Jun. 30, 2020, both of which are incorporated herein by reference.

TECHNICAL FIELD

The present application describes a system for real-time continuous and remote monitoring of the progressive degradation of insulators installed in Electric Power Transmission Networks, namely in Very High Voltage electric Lines (VHVL), which can be applied at lower voltage levels (High and Medium Voltage).

BACKGROUND

Overhead power line insulators have the function of insulating the conductors, ensuring their fixation and mechanical support to the supports. In a chain, the number of insulators is determined by the voltage level and the length of the leakage line required for the insulation to be effective.

A chain of insulators consists of insulators and metallic accessories that connect their ends to the supports and conductors and incorporates discharge rods in its structure. The discharge rods are used to standardize the electric field along the insulator chain and provide protection against the effects of the arc itself. However, service conditions such as lightning strikes, switching overvoltage or pollution can cause short-circuit (flashover) insulation failures, followed by electric arcs of power that can, depending on the amplitude and time of current elimination, lead to destruction of insulators and ultimately break and fall of the line.

Insulators therefore play a critical role in the operation of electricity transmission and distribution lines, so the safety and stability of these components are of the utmost importance. However, as air pollution increases, contaminating particles adhere to the insulators' surface, severely affecting their stability. In this sense, monitoring the condition of the insulator and preventing insulation failure (flashover) are crucial to maintain the safe and stable operation of the electric lines.

The degradation of the insulating properties of the insulators can be caused by two processes: intrinsic degradation of the insulator materials or by accumulation of pollution on the surface thereof.

The intrinsic degradation of insulator materials can be caused by several factors, including: natural aging of the materials, which may be greater or lesser depending on the environmental conditions from which they are installed, electric phenomena (lightning strikes or network overvoltage), mechanical deformations, etc. These phenomena are generally permanent and might eventually lead to the need to replace the insulator.

Degradation by pollution begins with the accumulation of matter on the surface of the insulator, such as minerals present in the environment, particles from pollution, bird waste, among others. With the increase in humidity in the air (due to fog, downpours or other weather phenomena) the accumulated particles will dissolve and create areas along the insulator with varying resistivity. The electric field present due to the potential difference between the ends of the insulator causes leakage currents in this conductive layer, which in turn increases the temperature in these areas. This leads to sedimentation of the deposited materials and further increases the conductivity in certain areas on the surface of the insulator (dry bands). In these areas, depending on the intensity of the current, partial discharges occur (or PD) which in turn destroy and clean the areas that originate them. With the increase in PD, ultimately, they can ionize the air and give rise to a flashover.

In composite material insulators, this effect is lower, since the materials themselves have hydrophobic properties that delay these effects, with the material having some self-healing ability of the insulation. However, in glass or ceramic insulators, with periodic washing, these deposits can be removed, reversing the process. Thus, preventive and periodic maintenance extends the useful life of the glass or ceramic insulator, safeguarding the risk of failure, although risk management translates into maintenance costs that in some countries assume significant values. Additionally, it is mentioned that the adoption of maintenance by washing may not always be effective because, since the intervention decision is based on qualitative assessment, it depends on the ability of decision-makers based on experience. While an operator with a less conservative assessment profile may not avoid some failures and still bear the cost, an operator with a more conservative profile may incur higher costs to ensure the occurrence of failures.

On the other hand, like any asset in operation, insulators have a life cycle, at the end of which they must be replaced. However, the combination of factors such as the diversity of construction materials (ceramics, glass, composite), age, the diversity of technological generations, the quality performance of the manufacturers, the exploitation regime of the assets and the external aggression to which they are subject during their useful life, create restrictions for an optimized investment decision. Without a real technical assessment, it will not be possible to ensure that the replacement occurs at the end of its useful life. In the case of insulators, aging is evidenced by the loss of insulating characteristics, which technically results in an increase in leakage current.

Based on the above, it appears that the increase in the intensity and frequency (of occurrence) of the generated DPs is directly related to the increase in the degradation of the insulation (either due to pollution or degradation of the insulator). Thus, the detection of these phenomena can provide a direct assessment of the insulators' condition. These signals are characterized by being events lasting from about half a cycle to three wave cycles, and by having a great harmonic content. In other words, the signal is composed of the fundamental component (50 Hz) and components of 150 Hz, 250 Hz, etc.

In this context, transmission network operators have sought to investigate methods of detecting and monitoring pollution in Very High Voltage Line (VHVL) insulators, with the aim of developing solutions that allow better monitoring of insulators, optimizing the actions of maintenance and preventing the occurrence of failures.

The developed system then presents a solution that, based on the process of measuring leakage currents in the insulators, allows to identify scenarios of risk of failures in the transmission and distribution networks caused by pollution and/or degradation of insulators.

SUMMARY

The present application describes the operating method of a leakage and flashover monitoring system in overhead line insulators, characterized in that it comprises the steps of:

measuring leakage currents from the line to the ground via the isolator;

estimating the contamination and/or aging of the insulator;

estimating the condition of the insulator;

determining the maintenance action to be recommended on the insulator.

In one embodiment of the operating method of the monitoring system, the measurement of leakage currents comprises filtering the 50 Hz component.

In yet another embodiment of the operating method of the monitoring system, the estimation of contamination and/or aging of the insulator corresponds to the count and intensity of partial discharges identified in the current signal.

In yet another embodiment of the operating method of the monitoring system, the estimation of the insulator condition results from a correlation of the level of contamination and/or aging of the insulator with the environmental and weather conditions where it is in operation, namely the ambient temperature, relative humidity and solar radiation.

In yet another embodiment of the operating method of the monitoring system, the maintenance action to be recommended on the insulator is automatically determined from the estimation of the insulator condition, which includes:

Need to wash the insulator in the short term;
Need to wash the insulator immediately;
Need to replace the insulator in the short term;
Need to replace the insulator immediately.

The present application further describes the system for monitoring leakage and flashover currents in overhead line insulators according to the method described above, characterized in that it comprises at least one current sensor, installed in an extension of a support, above an electric insulator supporting the overhead transmission line, comprising a current reading device, an analog interface, which performs the reception, filtering and amplification of the analog signal coming from the current reading device, a magnetic field detection unit, for determining the magnetic field present in the overhead transmission line and activate the leakage current reading via the current reading device, a central processing unit, which performs the A/D conversion and storage of the signal coming from the analog interface, and a communications system; a gateway comprising a temperature and relative humidity sensor, a central processing unit, a communications system, and a modem; and a coordinating center, connected remotely to the gateway by means of a telecommunications network; wherein the gateway communicates with the at least one current sensor via the communications system to perform parameter transmission, and to collect the converted A/D values stored in the at least one current sensor, and wherein the gateway communicates with the coordinating center via the modem to send the data collected from the at least one current sensor and respective values from the temperature and relative humidity sensor.

In one embodiment of the monitoring system, the parameters of the at least one current sensor are adjusted by the gateway, via the communications system, based on the weather values collected by the temperature sensor, relative humidity and/or radiation, and the forecasted weather values sent by the coordinating center via the telecommunications network.

In yet another embodiment of the monitoring system, the at least one current sensor additionally comprises a system for sampling the signal collected by the current reading device at a predetermined frequency, and a third-order Sallen-Key high-pass three filter cascade to perform the filtering of said signal in its fundamental component. In one of the proposed embodiments, the predetermined frequency has a value of 18.9 kHz.

In yet another embodiment of the monitoring system, the at least one current sensor comprises an energy collection module, a charge controller, an energy management module, and an energy storage module.

In yet another embodiment of the monitoring system, the gateway comprises an energy collection module, a charge controller, an energy management module, and an energy storage module.

In yet another embodiment of the monitoring system, the coordinating center comprises at least one database for storing information collected from the at least one current sensor through communications with the gateway, and an information analysis system for the respective data.

In yet another embodiment of the monitoring system, the coordinating center's information analysis system issues warnings based on the information collected and based on weather forecasts.

In yet another embodiment of the monitoring system, the current reading device comprises the use of a Rogowski coil.

In yet another embodiment of the monitoring system, the current reading device comprises an electric field shielding element.

In yet another embodiment of the monitoring system, the at least one current sensor comprises three operating modes: installation mode, sleep mode and normal mode.

In yet another embodiment of the monitoring system, the gateway comprises three operating modes: installation mode, sleep mode and normal mode.

The present application further describes the operating method of the at least one current sensor characterized in that it remains in each period of 60 seconds, 40 seconds inactive and 20 seconds active, awaiting the establishment of the BLE connection with the gateway, which subsequently to its establishment, synchronizes both clocks, the current sensor receiving the settings.

The present application further describes the operating method in the sleep mode of the at least one current sensor, wherein the at least one sensor is in energy savings, remaining only with the internal clock operational, with the remaining modules turned off, allowing to increase the duration and autonomy of the energy storage module.

The present application further describes the operating method in the normal mode of the at least one current sensor, wherein the at least one sensor measures the leakage current and collects the data corresponding to 30 seconds of measurements, and subsequently to data collection, the sensor communicates with the gateway, again receiving the settings and synchronizing the clocks, and then transmitting the collected data and returning to the sleeping state.

The present application further describes the operating method of the at least one sensor of the monitoring system, which comprises the steps of measuring the leakage currents for 30 seconds,
creating a histogram of the measured current,
sending the histogram to the gateway, and
entering the sleeping state for 30 minutes.

The present application further describes the operating method of the monitoring system gateway, which comprises the steps of Establishing the communications connection with the at least one sensor;
communicating data with the at least one sensor, synchronizing parameters and clock;
Validating, transmitting and respective storing of data;
Transmitting data to the server.

BRIEF DESCRIPTION

Pollution is one of the biggest causes of failure of operation of power transmission line insulators, severely affecting their insulating characteristics, degrading them.

Partial discharges occur when there is a degradation of the insulation between two conductors and, in the failure of the insulator, the infiltration of humidity will allow the occurrence of discharges in the presence of a given voltage level. The greater the degradation of the insulators, the greater the likelihood of failure in the presence of humidity.

Bearing in mind the fundamental role that insulators play in the insulation between conductors and supports, thus ensuring reliability of the electric system, its correct maintenance assumes a fundamental role to prevent leakage currents resulting in flashovers.

In this sense, operators of electricity transmission and distribution networks seek to prevent interruptions in service from polluted insulators. To do this, they use pollution control methods, namely:
  i. study of the pollution levels of the network, taking into account that it crosses geographical areas with different characteristics;
  ii. control of the pollution of the insulators, in order to determine the need for cleaning operations;
  iii. study of the behavior of different insulator designs and materials in order to determine the most suitable insulators for different types of pollution.

In view of this context, transmission system operators have sought to investigate methods of detecting and monitoring pollution in Very High Voltage Line (VHVL) insulators, aiming at developing solutions that allow better monitoring of insulators and preventing the occurrence of failures.

The developed system then presents a solution that, based on the permanently active data collection process, allows the identification of risk scenarios for the occurrence of insulation failure in the insulator chains of Very High Voltage Lines (VHVL) caused by pollution or aging.

In this context, and serving as a support base for the maintenance of these components, the system allows to identify in real time and in a preventive perspective, the intervention needs in order to guarantee the physical integrity of the insulators, monitoring in real time the leakage and flashover currents in the insulators installed in Very High Voltage Lines (VHVL), originated by pollution deposited therein or aging, and which, supported by a risk assessment model, has predictive maintenance capabilities.

The developed tool uses intelligent sensors based on a prevention algorithm, which is based on current leakage patterns related to the characteristics associated with:
  i. isolator pollution;
  ii. age of insulators;
  iii. relative humidity and incidence ranges on insulators based on pre-characterized types of pollution and indicative of the need to wash or replace these insulators.

The developed system then consists of at least one current sensor, responsible for monitoring leakage currents and sending measurements to the data processing system.

If there is more than one sensor, a gateway can be used that will be responsible for aggregating the data transmitted by the sensors.

Through the sensor or the gateway, it is possible to measure the ambient temperature and humidity.

The transmission of all data to a central server can be carried out over any fixed or mobile communications system, such as Long Term Evolution (LTE)—4G.

The monitoring system composed of the current sensors is responsible for monitoring the leakage currents, for the internal processing of these data and for communicating the relevant events that comes to identify. If a gateway is used that collects data from several sensors, communications between the sensors and the gateway will be carried out using any communications technology, such as Bluetooth.

The sensors are supplied by a local energy storage system, which may or may not be rechargeable. In the case of being rechargeable, the local storage system will be charged via a local power generation system, or energy collection module, such as solar panels.

Such a supply system allows the sensing system to function, either at night or on cloudy days when sunlight may not be enough to charge the storage system.

A non-rechargeable power system may be based on the 'energy harvesting' approach, which consists of collecting energy via the magnetic field available in the vicinity of the line's conductive cables.

Based on the characteristics analyzed in the insulators, namely regarding leakage currents and relative humidity, the behavioral patterns of the developed system are based, in one of the proposed embodiments, in the following scenarios:
  i. Need to wash the insulator in the short term (between 3 and 6 months)—Yellow;
  ii. Need to wash the insulator immediately (less than 1 month)—Red;
  iii. Need to replace the insulator in the short term (between 3 and 6 months)—Yellow;
  iv. Need to replace the insulator immediately (less than 1 month)—Red.

In order to guarantee the correct operation and veracity of the values collected on the site, the developed system was tested in a laboratory environment simulating a real installation, in a saline fog chamber, under which a set of tests were carried out.

BRIEF DESCRIPTION OF THE FIGURES

For an easier understanding of the present application, figures are herein attached, which represent embodiments which however are not intended to limit the art herein disclosed.

DESCRIPTION OF EMBODIMENTS

Figure 1:
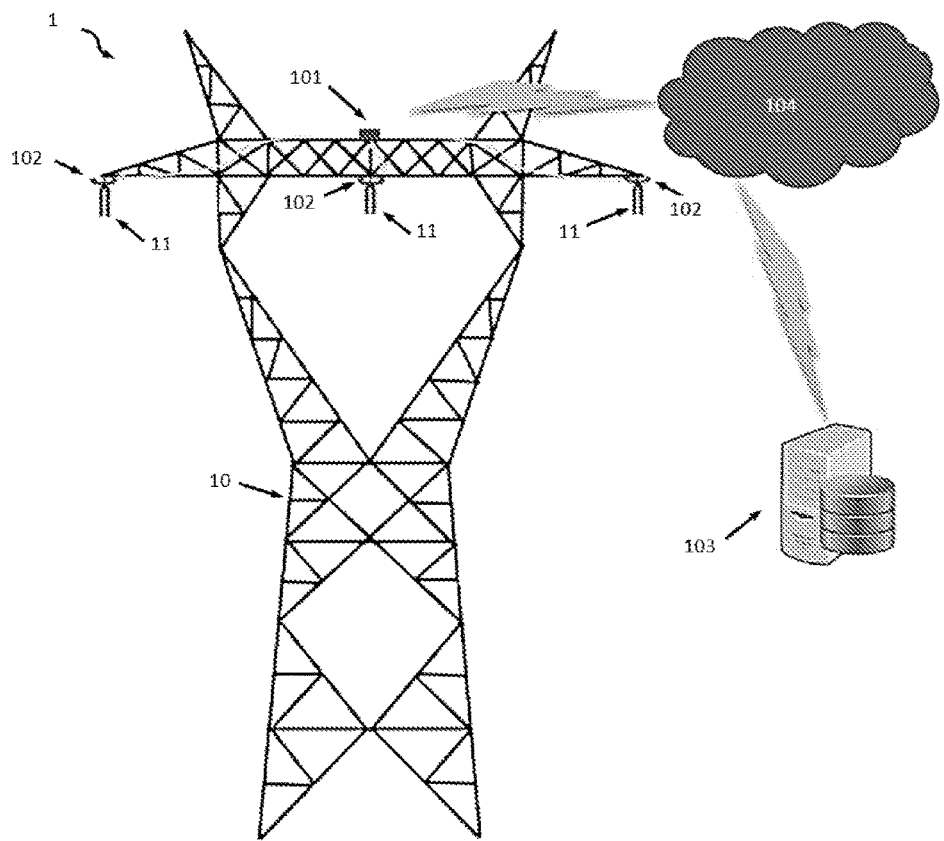
FIG. 1 illustrates the simplified scheme of the system for monitoring the condition of insulators in overhead lines (1), wherein reference numbers represent:
  10—VHV Line support,
  11—insulator,
  101—gateway,
  102—current sensors,
  103—coordinating center,
  104—telecommunications network.

Referring to the figures, some embodiments are now described in more detail, which are not intended, however, to limit the scope of the present application.

The present application describes a system (1) for real-time remote and continuous monitoring of the progressive degradation of insulators installed in Electric Power Transmission lines. The developed system (1) consists of one or more current sensing devices, or current sensors (102), and an information analysis system of the collected data, or coordinating center (103).

In one of the proposed embodiments, the use of a gateway (101) to collect data from the sensors (102), and relay them via a telecommunications system (104), mobile or fixed, to the coordinating center may be considered (103).

Figure 2:
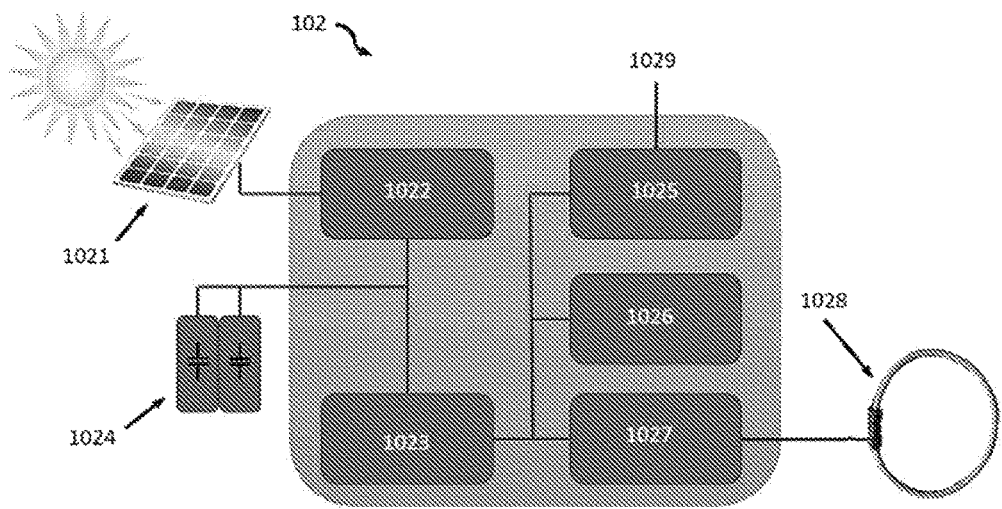
FIG. 2 illustrates the block diagram of the constituent elements of a current sensor (102), wherein the reference numbers represent:
  1021—energy collection module,
  1022—charge controller,
  1023—energy management module,
  1024—energy storage module,
  1025—central processing unit, CPU,
  1026—magnetic field detection unit,
  1027—analog interface,
  1028—current reading device,
  1029—communications system.
Figure 3:
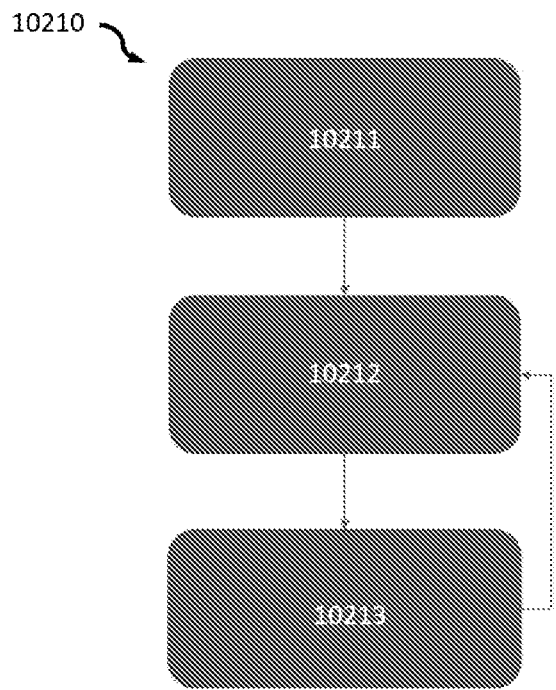
FIG. 3 illustrates the block diagram representative of the operating modes (10210) of the current sensor (102), wherein the reference numbers represent:
  10211—installation mode,
  10212—sleeping mode,
  10213—normal mode.
Figure 4:
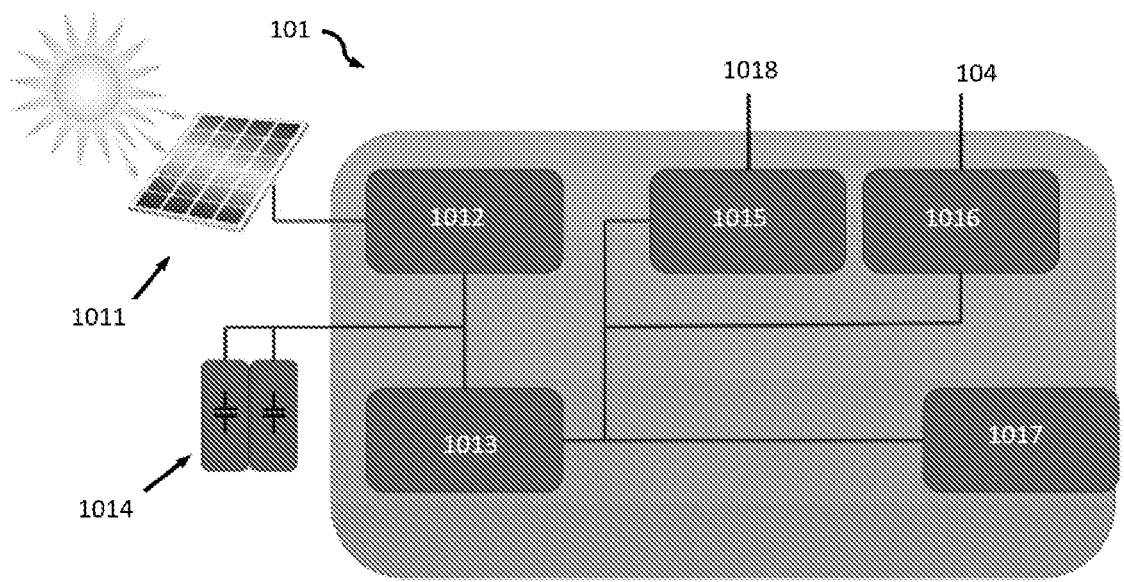
FIG. 4 illustrates the block diagram representative of the constituent elements of the gateway (101), wherein the reference numbers represent:
- 104—telecommunications network,
- 1011—energy collection module,
- 1012—charge controller,
- 1013—energy management module,
- 1014—energy storage module
- 1015—central processing unit, CPU,
- 1016—modem,
- 1017—temperature and relative humidity sensor,
- 1018—communications system.

In terms of hardware, each current sensor (102), and according to FIG. 2, consists of the following elements:
- energy collection module (1021), for example, solar panels;
- energy storage module (1024), for example, a battery of supercapacitors;
- communications system (1029), for example Bluetooth or LoRaWAN (Long Range Wide Area Network);
- current reading device (1028), for example a Rogowski coil (this device will be decisive in collecting leakage currents, and the model in question may incorporate an integrating system);
- Electric field shielding element (in one of the proposed embodiments, this shield is applied to the current reading device (1028));
- Electronics required for the operation of the sensory unit (102), namely, charge controller (1022), energy management module (1023), central processing unit (1025), magnetic field detection unit (1026) and analog interface (1027).

The proposed sensor (102), which is not limited to the previous description, may incorporate, in a complementary way, additional sensor blocks, such as, for example, magnetic field sensors, relative humidity sensors, temperature sensors, among others.

Regarding the constituent blocks of the current sensor (102), each sensor is composed of an energy collection block (1021), which is responsible, for example, for the use of solar energy via the charge controller (1022) and subsequent charging of the energy storage module (1024). The energy management of the sensor is carried out by the respective module (1023). The analog interface (1027) is responsible for filtering, amplifying and comparing the analog signal from the current reading device (1028), allowing it to be digitized by the central processing unit (1025). The magnetic field detection unit (1026) is responsible for detecting and measuring the magnetic field, in order to identify and measure the current range present in the transmission lines, as well as to determine the need for measurement of leakage currents. The central processing module (1025) is responsible for the analog to digital conversion (A/D conversion) of values collected by the current reading device (1028), which were previously subject to treatment at the analog interface (1027), being internally processed for subsequent sending to gateway (101) via the communications system (1029).

One aspect to be taken into account when implementing the proposed sensing model is the presence of strong external magnetic and electric fields from the electric power transmission lines. The disturbance caused by the electric field in the current sensor (102) can be canceled by using an electric shielding system in said sensor (102). The cancellation of disturbances resulting from the action of the magnetic field is more complex. Given the geometry and distribution of the field lines, they will generate a concentric magnetic field inversely proportional to the distance from the sensor to the line. Under these conditions, and for nominal current values in VHV Lines, the magnitude of these fields at the sensor level will be in the order of a few µT. By geometry, these magnetic fields (essentially with 50 Hz frequency, according to the line current) will also be detected by the current collection device (1028) used in the sensor (102), which will affect the value of the measurements related to leakage currents. In order to solve this problem and given the characteristics of the signals to be detected (partial discharges, or partial discharges (PDs) with total harmonic distortion, or high total harmonic distortion (THD)), the developed system takes into account only the harmonic components of the signals measured by the current collection device (1028), in the proposed case, by the Rogowski coil. Thus, the effects introduced by external magnetic fields will be neglected, without loss in PD detection.

The use of the Rogowski coil, in one of the proposed implementation methods for the sensor (102), and for the monitoring of the leakage currents of the insulators (11) installed in VHV electric lines in operation, presents advantages since it guarantees the non-saturation in the presence of high currents due to its linear behavior, being useful and reliable in the measurement under flashover conditions. In addition to having a high bandwidth, allowing the monitoring of a wide range of amplitudes, it also allows performing it over a wide range of frequencies, relevant to the method in question. In addition, its 'open core' design facilitates installation on the support and an untimely opening of the secondary circuit does not result in the destruction thereof. Finally, it has a reduced cost when compared to other alternatives. The application of the Rogowski coil is not limited to applications in VHV lines, so it becomes possible to apply it, and the respective sensor (102), in lines with voltage higher than 60 kV, high voltage at 60 kV and medium voltage between 10 kV and 60 kV.

As previously mentioned, the increase in contamination or aging of the insulator (11) is proportional to the number and intensity of partial discharges. The signal measured by the sensor (102) will correspond to the electric signal itself (with the network frequency at 50 Hz), added to the sensor noise, which is expected to be white, that is, wherein the successive noise samples are not correlated between with each other. The effective value of the RMS (Root Mean Square) current of the signal, filtered by the fundamental component, will then increase with the number and intensity of the discharges, being possible to visualize in histogram the intensity of this current in bins (occurrence counter within a determined range of values) that divide the intensity of this current in several levels, being that the higher bins (or levels) are equivalent to a greater presence of discharges, and consequently, to a greater degradation of the insulator.

The signal sampled by the sensor (102) corresponds to the electric signal itself, added to the sensor's white noise, making successive noise samples not correlated with each other, and, in case of partial discharges, peaks corresponding to discharges due to the combination of the presence of moisture and degradation of the insulation. Thus, the peaks from the partial discharges will correspond to noise added to the signal. As a consequence, it is possible to measure the degree of degradation of the insulator by observing the impact of partial discharges on background noise, ignoring the fundamental component, hence its amplitude is not monitored. The sensor (102) performs a signal sampling with a sampling frequency of 18.9 kHz and performs a filtering of the collected signal with a third-order Sallen-Key high-pass three filter cascade, and subsequently, the successive samples of the signal will be used to fill a histogram that will allow distinguishing a situation of absence/presence of partial discharges.

The design of the current sensor block (102) took into account two fundamental factors: the operating point must be such that it allows the charging of the energy storage module (1024) under less favorable solar conditions, even if this is the case of waste of energy on days of intense sunlight; and the charging of said storage module (1024) must take into account the correct charge balance of each element. The energy management module (1023) is responsible for using the battery charge to supply the system. It regulates the value of the storage module (1024) to an appropriate voltage level, ensuring the correct operation of the system.

The current sensor (102) has three operating modes: installation mode (10211), sleeping mode (10212) and normal mode (10213). In the installation mode (10211), related to the installation of the sensor (102) in the support (10), the sensor (102) remains in each period of 60 seconds, 40 seconds inactive and 20 seconds active, waiting for the establishment of the Bluetooth Low Energy (BLE) connection with the gateway (101). As soon as it establishes communications with the gateway (101), the clocks are synchronized between both, and the current sensor (102) receives the settings, and then transitions to sleeping mode (10212). Whenever the sensor (102) loses energy completely, it goes into installation mode as a way of protection, to guarantee the correct synchronism and the quality of the collected data. In the sleeping mode (10212), the sensor (102) is in energy saving status, only the internal clock remaining operational, with the remaining modules turned off, allowing to increase the duration and autonomy of the energy storage module (1024). In normal mode (10213), the sensor (102) measures the leakage current and collects data corresponding to 30 seconds of measurements. Subsequently to data collection, the sensor (102) communicates with the gateway (101), again receiving the settings and synchronizing the clocks, and then transmitting the collected data and returning to the sleeping status. In terms of operation, the sensor (102) alternates between the sleeping status and the normal status according to an established schedule.

The remote monitoring system (1) of the insulators, or gateway (101), also has the ability to receive data with weather forecasts, and to adjust upon this information the measurement needs of the sensors (102). The adjustment of the measurement characteristics is carried out dynamically, and the information related to solar radiation, temperature and relative humidity, or probability of occurrence of precipitation, will serve as an adjustment factor to improve the measurement windows, as well as the rates of data reception. This adjustment is also fundamental in order to guarantee the correct management of the energy storage module charge (1024), which is managed by the energy management module (1023), guaranteeing its efficiency and effectiveness in the most critical and fundamental periods of the information collection operation.

With a sufficient number of sensors installed in different geographic zones, and in different environmental and meteorological regimes, it is possible to understand the relationship between the measured signal and the various variables to be considered such as temperature, relative humidity, solar radiation, etc. This allows isolating signal variations correlated with the PDs associated with environmental changes. This system also allows to increase and improve the ability to parameterize the limits imposed for alarms, mitigating untimely alarms, increasing the reliability of the system.

With greater knowledge of the relationship between these variables, the forecasts of the need for maintenance will also become more accurate, as well as forecasts for replacing insulators (11).

The data collected and stored by the gateway (101), and periodically transmitted to the coordinating center (103), are stored in a local or remote database (BD) for later export and analysis, the reading being possible by means of a graphical interface. The visualization of the information produced by the collection and storage system (1), is made possible through a platform developed for the purpose.

The main function of the gateway (101) is to collect data from the various sensors installed using the communications system (1018), which is based on the same communications technology (1029) used in the sensor (102), and to ensure the correct routing of the values collected for the server database, via the use of the telecommunications network (104). The gateway (101) also has the task of monitoring and recording the weather conditions at the installation site, having at least one temperature and relative humidity sensor (1017).

As for the power supply of the gateway (101), the system used may be identical to that used in the current sensors (102) and is based on the use of an energy collection module (1011) and an energy storage module (1014), although in the case of the gateway (101), the energy needs are greater than those of the sensors (102), leading to a higher installed capacity in this equipment.

From a hardware point of view, the gateway (101) consists of the following elements:
energy collection module (1011), for example, solar panels;
energy storage module (1014), for example, a battery of supercapacitors;
temperature and relative air humidity sensor (1017);
Modem (1016) and a communications system (1018);

Electronics necessary for the operation of the unit, which may also include a charge controller (1012), an energy management module (1013) and a central processing unit (1015).

Regarding the Central Processing Unit (1015), it controls all operations carried out by the gateway (101). It holds the commands of the operations inherent to the various modes of operation, which obey the requirements for the application in question.

The operating modes defined at the gateway (101), are identical to those of the current sensors (102), and are defined by installation mode, sleeping mode, and normal mode. For this purpose, the CPU performs the necessary actions in each mode, also deciding whether the necessary and/or adequate conditions exist for changing the operating mode.

In general, and in one of the proposed embodiments, the monitoring system (1) developed and applied in each of the towers (10), has three sensors that work as follows: Sensor 1 measures leakage currents for 30 seconds, creates the histogram of the measured current and sends it to the gateway (101). After sending, it goes into a sleeping status for 30 minutes. Sensor 2 has exactly the same operation as sensor 1, but with an operational lag of 10 minutes, just like sensor 3, but this with an operational lag of 20 minutes in relation to sensor 1. Briefly, the system presents histograms of 30 seconds of measurement every 10 minutes, but of the various sensors of the same support. The created system allows its installation in VHV supports that are in service without the need to turn off the power as described in the document below.

The modem (1016) of the gateway (101), is responsible for establishing a communications channel (104) between the system (1) mounted in support (10) and a remote server, or coordinating center (103). The modem (1016) that accompanies the unit, allows, in one of the proposed embodiments, communications via 4G mobile network. If there is no mobile network coverage (104) at the installation site, the modem (1016) also allows data transmission using other technologies such as WCDMA or GSM. Preferably, data communications will be carried out using the LTE (4G) standard. Through this communication over the mobile network (104), the gateway (101) communicates to the remote server (103) the data collected by the sensors (102), the voltage level of the energy storage module (1024) of each of the sensors (102), the voltage level of the energy storage module (1014) of the gateway (101), as well as the weather data recorded by the latter. In the normal operating mode of the gateway (101), four main actions are performed sequentially:

1. Establishing the communications connection with the sensors (102);
2. communicating data with the sensor (102), synchronizing parameters and clock;
3. Validating, transmitting and respective storing of data;
4. Transmitting data to the server (103).

Starting with the first action, the gateway (101) wakes up and starts scanning the communications connection, for example Bluetooth, trying to establish contact with one of the sensors (102). The purpose of this first action is to carry out the data exchange, provided for in the second action. In the second operation, the gateway (101) is responsible for resynchronizing the clock to the sensor and sending the settings, which may have meanwhile been changed by the user on the platform. During this interaction, the gateway awaits the reception of the recorded data, namely a histogram of the measured leakage current intensities and the voltage level of the energy storage module (1024) of the sensor (102). Thus, the connection to the sensor (102) is terminated. After receiving the data, the gateway (101) validates the received date and saves the data received from the sensor (102) in physical memory, tagging each sensor (102) with an identifier. In this phase, it also validates and saves recorded data on the voltage of the energy storage module (1014) of the gateway (101) and the temperature and humidity coming from the sensors (1017) and that was felt throughout the active period of operation thereof. The fourth, and last action, begins by checking whether, or not, there should be communication with the server at that moment, according to the configured communications period. If so, the gateway (101) establishes a connection with the server (103), in order to transmit the data in memory. On the other hand, if the communications period has not yet been reached, the gateway goes into sleeping mode. This last action is not limiting in terms of the order in which it occurs, so it could be the server or coordinating center (103) establishing the connection with the remote gateway (101).

Figure 5:
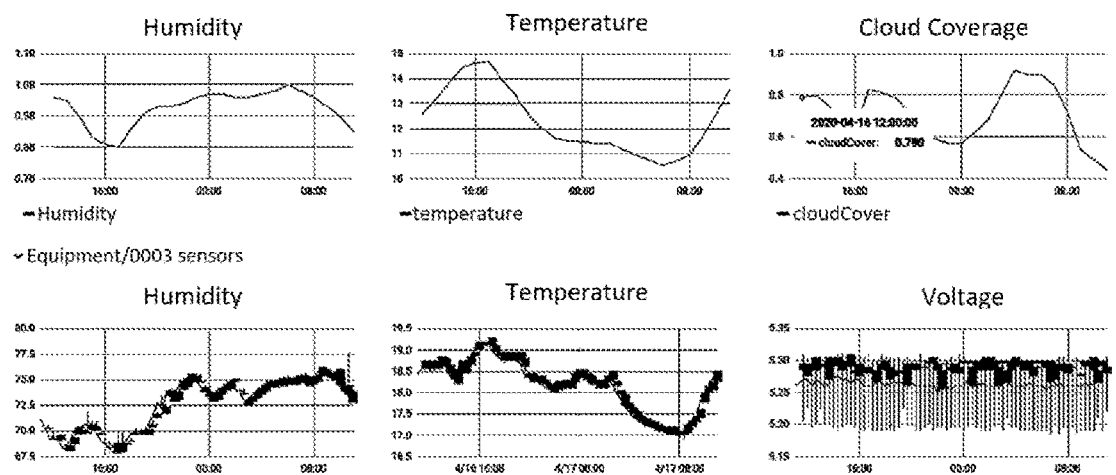
FIG. 5 illustrates the representation of temperature, relative humidity and cloud cover data, using weather forecasts, and values collected from humidity, temperature and battery level by the gateway (101) installed on the ground.
Figure 6:
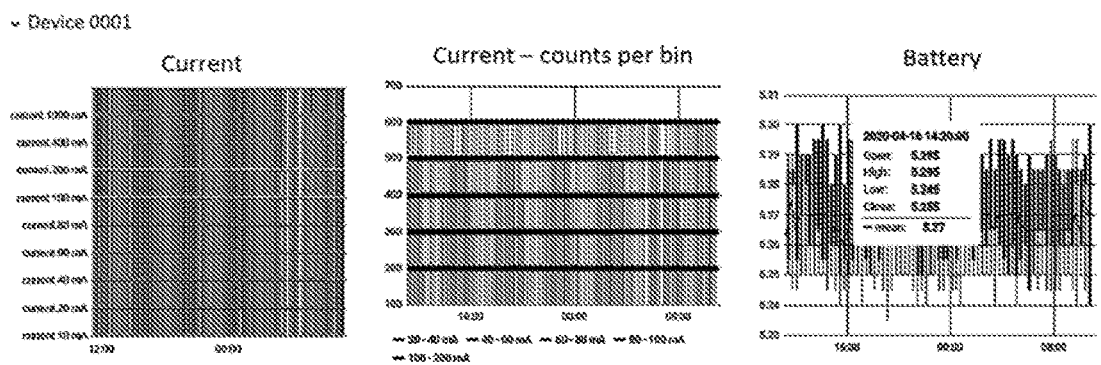
FIG. 6 illustrates the representation of the data relating to the current histograms collected by the devices, i.e., current sensors (102), and subsequently transmitted by the gateway (101) to the coordinating center (103) via the telecommunications network (104).
Figure 7:
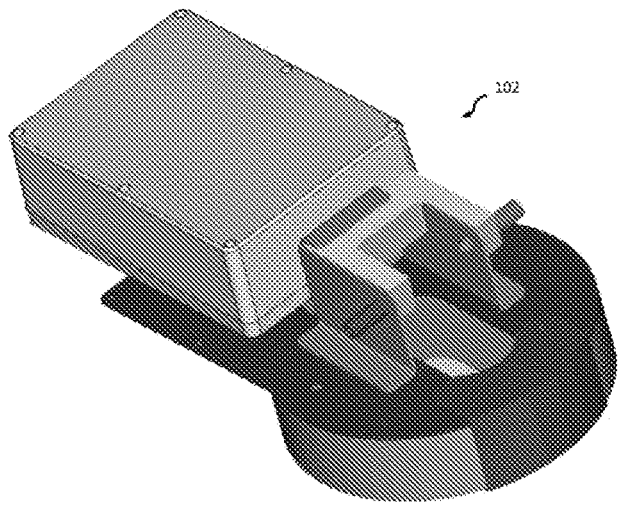
FIG. 7 represents an embodiment and external appearance of the current sensor (102).

Regarding the global parameters analyzed in the application, and collected by the coordinating center (103), three graphs are presented relating to air temperature, relative humidity and cloud coverage, as in FIG. 5. This information is obtained via an Application Programming Interface (API), which provides weather data for the coordinates requested and correlated with the location of the installation of the sensors (102). These data are independent of the data collected by the sensors (102) and also include future forecasts. The application allows the comparison, by means of graphic visual analysis, of the weather data provided by the API with the data collected locally by the systems installed on the ground. The server, or coordinating center (103), also has the function of generating associated alarms when there are pre-defined conditions for the need to wash or change the insulators, with different levels of severity. As for washing, there is a less severe level of need for washing the insulator within 6 months and the most severe level of washing within less than 1 month. Regarding the replacement of the insulator, it presents the same levels, less severe replacement within 6 months and more severe replacement within less than 1 month.

The definition and transmission of new parameters to the remote equipment in real time via the API of the coordinating center (103), as well as the query for the current parameters and their history is possible and, in one of the proposed embodiments include:

Binning histograms;
Scheduling data reception periods;
Setting alarm limits;
Acquisition parameters.

For the installation of the monitoring system (1), there is no need to remove the service line, disconnecting the power supply, nor the need to resort to the use of unconventional tools when considering VHV line maintenance operations. The sensors (102) are constructed in such a way that they can be installed in a wide range of extensions, a fixture for fixing the insulator chain (11) to the support of the support (10). The installation process is simple by just attaching the sensor to the extension of the support (10) using indentation screws, closing the coil and putting the top cover of the sensor (102). The operation also considers the need to attach the energy collection module (1021), the sensor being in full operation right after these steps. The installation process of the gateway (101) on the support (10) is in all similar, there being only the need to attach said equipment to the support (10), as well as the respective energy collection module (1011). Immediately after installation and commissioning, it will be possible to confirm using the communications systems, with the commissioning protocol still at the installation site.

The present description is of course in no way restricted to the embodiments presented herein and a person of ordinary skill in the art may provide many possibilities of modifying it without departing from the general idea as defined in the claims. The preferred embodiments described above are obviously combinable with each other. The following claims further define preferred embodiments.

The invention claimed is:

1. A method of operating a system for monitoring leakage and flashover currents in, and determine degradation of insulating properties of, overhead line insulators installed in Very High Voltage Lines (VHVL), the method comprising the steps of:
   establishing a communications connection between a coordinating center and a gateway;
   obtaining, by at least one sensor adapted to measure leakage currents from the overhead transmission line to a ground via the overhead line insulator, the at least one sensor comprising a current reading device having a Rogowski coil installed over the overhead line insulator, data related to the leakage currents and voltage levels;
   obtaining, by a gateway device having a temperature sensor and a humidity sensor, temperature data and humidity data;
   transmitting, by the gateway to the coordinating center, the data related to the leakage currents and voltage levels, the temperature data, and the humidity data;
   transmitting, by the coordinating center to the gateway, forecast weather values;
   displaying the transmitted data related to the leakage currents and voltage levels, the temperature data, and the humidity data to a user via one of a platform or API;
   estimating one of contamination, aging, or a condition of the overhead line insulator by counting a number of the leakage currents and intensities of the leakage currents, at a sampling frequency of 18.9 kHz with further filtering by a third order Sallen-Key high-pass three filter cascade; and
   determining one or more maintenance actions to be performed on the overhead line insulator based on the data related to leakage currents and voltage levels, the temperature data and the humidity data.

2. The method of operating the system according to claim 1, wherein a measurement of leakage currents comprises filtering the 50 Hz component.

3. The method of operating the system according to claim 1, wherein estimating the condition of the overhead line insulator results from a correlation of the contamination and/or aging level of the insulator with environmental and weather conditions where the overhead line insulator is operating, the weather conditions ambient temperature, relative humidity of the air and solar radiation.

4. The method of operating the system according to claim 1, wherein the one or more maintenance actions to be performed on the overhead line insulator is are automatically determined based on results of the estimating of one of contamination, aging or a condition of the overhead line insulator, the one or more maintenance actions comprising one of:
   a need to wash the overhead line insulator in the short term;
   a need to wash the overhead line insulator immediately;
   a need to replace the overhead line insulator in the short term; or
   a need to replace the overhead line insulator immediately.

5. A system for monitoring leakage and flashover currents in, and determining degradation of the insulating properties of, overhead line insulators installed in Very High Voltage Lines (VHVL) according to the method described in claim 1, comprising:
   at least one current sensor, installed on an extension of a support, comprising:
      a current reading device comprising a Rogowski coil installed over an overhead line insulator supporting an overhead transmission line;
      an analog interface, configured to perform reception, filtering and amplification of an analog signal from the current reading device;
      a magnetic field detection unit configured to determine a magnetic field present in the overhead transmission line and activate a leakage current reading via the current reading device,
      a central processing unit configured to perform an A/D conversion and storage of the analog signal from the analog interface; and
      a communications system;
   a gateway comprising
      an air temperature and relative humidity sensor;
      a central processing unit;
      a communications system; and
      a modem;
   wherein the gateway is configured to communicate with the at least one current sensor, via the communication system, to carry out a parameter transmission and to collect the A/D values converted and stored in the at least one current sensor; and
   a coordinating center, remotely connected to the gateway by means of a telecommunications network;
   via the modem to receive the data collected from the at least one current sensor and the air temperature and relative humidity sensor;
   wherein the analog signal comprises a sampling frequency of 18.9 kHz with further filtering by a third order Sallen-key high-pass three filter cascade.

6. The system according to claim 5, wherein the parameters of the at least one current sensor are adjusted by the gateway, via the communications system, based on temperature and humidity values collected by the sensor and the forecasted weather values sent by the coordinating center via the telecommunications network.

* * * * *